(12) United States Patent
Sagneri et al.

(10) Patent No.: US 9,861,015 B2
(45) Date of Patent: Jan. 2, 2018

(54) METHOD AND APPARATUS FOR CONTROLLING HEAT IN POWER CONVERSION SYSTEMS

(71) Applicant: FINsix Corporation, Menlo Park, CA (US)

(72) Inventors: Anthony Sagneri, Menlo Park, CA (US); Vanessa Green, Menlo Park, CA (US)

(73) Assignee: FINsix Corporation, Menlo Park, CA (US)

( * ) Notice: Subject to any disclaimer, the term of this patent is extended or adjusted under 35 U.S.C. 154(b) by 193 days.

(21) Appl. No.: 14/210,859

(22) Filed: Mar. 14, 2014

(65) Prior Publication Data

US 2014/0268564 A1    Sep. 18, 2014

Related U.S. Application Data

(60) Provisional application No. 61/862,390, filed on Aug. 5, 2013, provisional application No. 61/794,633, filed on Mar. 15, 2013.

(51) Int. Cl.
*H05K 7/20* (2006.01)
*H01L 23/427* (2006.01)
*G06F 1/26* (2006.01)

(52) U.S. Cl.
CPC .......... *H05K 7/209* (2013.01); *H05K 7/2039* (2013.01); *H05K 7/20918* (2013.01); *G06F 1/26* (2013.01); *H01L 23/4275* (2013.01)

(58) Field of Classification Search
CPC ................ H05K 7/1432; H05K 1123/4275
See application file for complete search history.

(56) References Cited

U.S. PATENT DOCUMENTS

| | | | | |
|---|---|---|---|---|
| 4,349,446 | A * | 9/1982 | Marks | C09K 5/063 |
| | | | | 126/400 |
| 5,773,755 | A * | 6/1998 | Iwatare | H05K 7/202 |
| | | | | 174/17 VA |
| 6,081,425 | A | 6/2000 | Cheng | |
| 6,101,090 | A * | 8/2000 | Gates | H05K 7/20136 |
| | | | | 165/104.33 |
| 6,549,438 | B2 * | 4/2003 | Malone | H02M 7/217 |
| | | | | 363/127 |

(Continued)

FOREIGN PATENT DOCUMENTS

| | | |
|---|---|---|
| CN | 101252322 A | 8/2008 |
| DE | 10324156 A1 | 12/2004 |

(Continued)

OTHER PUBLICATIONS

International Search Report and Written Opinion dated Sep. 19, 2014 from PCT Application No. PCT/US2014/028316.

(Continued)

*Primary Examiner* — Robert J Hoffberg
(74) *Attorney, Agent, or Firm* — Wolf, Greenfield & Sacks, P.C.

(57) ABSTRACT

A power conversion module, such as a power adapter, includes a heat removal system such as an active heat removal system, a passive heat removal system or a hybrid heat removal system. A small-size power conversion module having a heat removal system is described.

32 Claims, 9 Drawing Sheets

(56) References Cited

U.S. PATENT DOCUMENTS

| | | | | |
|---|---|---|---|---|
| 6,621,702 | B2* | 9/2003 | Elias | H01L 23/3733 165/104.33 |
| 6,888,722 | B2* | 5/2005 | Viswanath | H01L 23/4275 165/185 |
| 6,951,513 | B1 | 10/2005 | Greenslade et al. | |
| 7,069,975 | B1* | 7/2006 | Haws | B64G 1/50 165/10 |
| 7,142,423 | B2* | 11/2006 | Lanni | H05K 7/20136 165/104.33 |
| 7,265,973 | B2* | 9/2007 | Lanni | H05K 7/20136 165/80.3 |
| 7,289,320 | B2* | 10/2007 | Chang | H05K 7/20145 165/122 |
| 7,355,851 | B2* | 4/2008 | Lanni | H05K 7/20136 165/80.3 |
| 7,416,017 | B2* | 8/2008 | Haws | B64G 1/50 165/10 |
| 7,436,661 | B2* | 10/2008 | Fong | H02M 7/003 323/211 |
| 7,492,597 | B2* | 2/2009 | Huang | H02M 7/003 361/690 |
| 7,646,606 | B2* | 1/2010 | Rytka | H05K 7/20927 165/104.33 |
| 7,679,906 | B2* | 3/2010 | Fong | H05K 7/20909 174/547 |
| 7,733,647 | B2* | 6/2010 | Lee | H05K 5/0213 361/690 |
| 7,843,684 | B2* | 11/2010 | Lu | H05K 5/06 165/104.33 |
| 7,929,301 | B2* | 4/2011 | Fong | H05K 7/20909 165/104.33 |
| 8,030,760 | B2* | 10/2011 | Toh | H01L 23/473 257/686 |
| 8,174,826 | B2* | 5/2012 | El-Essawy | G06F 1/18 165/104.33 |
| 8,405,995 | B2* | 3/2013 | Yumoto | H01L 23/367 361/709 |
| 8,542,509 | B2* | 9/2013 | Sagneri | H02M 3/158 363/69 |
| 8,780,552 | B2* | 7/2014 | El-Essawy | G06F 1/18 165/104.33 |
| 8,836,287 | B2* | 9/2014 | Smith | G06F 1/263 320/128 |
| 8,867,250 | B2* | 10/2014 | Hua | H02M 3/156 363/125 |
| 9,313,875 | B2* | 4/2016 | Wikander | G06F 1/1656 |
| 2003/0000689 | A1* | 1/2003 | Kuo | F28D 20/02 165/185 |
| 2003/0007328 | A1* | 1/2003 | Fischer | H01L 23/4275 361/704 |
| 2005/0007740 | A1* | 1/2005 | Neuschuetz | H01L 23/4275 361/704 |
| 2005/0104029 | A1* | 5/2005 | Neuschuetz | C09K 5/063 252/70 |
| 2005/0248923 | A1 | 11/2005 | Hsu | |
| 2007/0114967 | A1 | 5/2007 | Peng | |
| 2007/0115635 | A1 | 5/2007 | Low et al. | |
| 2007/0247817 | A1 | 10/2007 | Huang | |
| 2008/0198557 | A1 | 8/2008 | Lim et al. | |
| 2008/0304238 | A1 | 12/2008 | Chien et al. | |
| 2009/0284923 | A1 | 11/2009 | Rytka et al. | |
| 2010/0238633 | A1* | 9/2010 | Michenfelder | B60S 1/08 361/717 |
| 2010/0254092 | A1 | 10/2010 | Dong et al. | |
| 2010/0271775 | A1 | 10/2010 | Bult et al. | |
| 2011/0159864 | A1 | 6/2011 | Park et al. | |
| 2011/0278923 | A1 | 11/2011 | Pance et al. | |
| 2012/0069606 | A1 | 3/2012 | Sagneri et al. | |
| 2012/0074840 | A1 | 3/2012 | Chang et al. | |
| 2012/0206880 | A1* | 8/2012 | Andres | H01L 23/4275 361/700 |
| 2012/0235631 | A1 | 9/2012 | Nakashima et al. | |
| 2014/0268563 | A1* | 9/2014 | Sagneri | H05K 7/20909 361/692 |
| 2016/0212841 | A1* | 7/2016 | Hartmann | H05K 7/20454 |

FOREIGN PATENT DOCUMENTS

| | | | |
|---|---|---|---|
| DE | 102005034546 A1 | 1/2007 | |
| EP | 0948248 A1 | 10/1999 | |
| EP | 1656009 A2 | 5/2006 | |
| GB | WO 9628846 A1 * | 9/1996 | F28D 20/02 |
| JP | H01-248551 A | 10/1989 | |
| JP | 2002270765 A * | 9/2002 | |
| WO | WO 2012/024542 A2 | 2/2012 | |

OTHER PUBLICATIONS

Invitation to Pay Additional Fees dated Jul. 16, 2014 from corresponding PCT Application No. PCT/US2014/028316.

Chinese Office Communication for Application No. CN 201480021225.3 dated Mar. 23, 2017.

European Office Communication for Application No. EP 14720385.5 dated Mar. 20, 2017.

* cited by examiner

METHOD AND APPARATUS FOR CONTROLLING HEAT IN POWER CONVERSION SYSTEMS

CROSS-REFERENCE TO RELATED APPLICATIONS

This application claims priority under 35 U.S.C. 119(e) to U.S. provisional application Ser. No. 61/794,633, titled "METHOD AND APPARATUS FOR CONTROLLING HEAT IN POWER CONVERSION SYSTEMS," filed Mar. 15, 2013, and U.S. provisional application Ser. No. 61/862,390, titled "METHOD AND APPARATUS FOR CONTROLLING HEAT IN POWER CONVERSION SYSTEMS," filed Aug. 5, 2013, each of which is hereby incorporated by reference in its entirety.

DISCUSSION OF RELATED ART

Power adapters are widely used for powering and charging electronics, including consumer electronic devices such as cellular telephones and laptop computers, by way of example. A standard AC/DC power adapter converts the AC line voltage provided by a standard electrical outlet into a DC voltage accepted by an electronic device. A typical AC/DC power adapter for a laptop computer has a brick-shaped power conversion module with the necessary electronics for performing AC/DC power conversion. The power conversion module is attached to one cord with a plug that can be plugged into a standard electrical outlet and another cord with a connector that can be plugged into a laptop computer to power the laptop computer and/or charge its battery. A power adapter can provide voltage regulation, electrical isolation and protection from line surges.

Power adapters for consumer electronic devices tend to be large and heavy. In particular, power adapters for portable electronic devices that draw a larger amount of power (e.g., greater than 40 W), such as laptop computers, for example, are relatively large and heavy. Some power adapters for laptop computers can be more than 20% of the weight of the laptop computer itself. For a mobile device, such as a laptop computer, having a large and heavy power adapter can be particularly cumbersome, as the user may need to carry around such an adapter when the user expects to be away from a power outlet for any significant period of time.

SUMMARY

Some embodiments relate to a power adapter. The power adapter includes a housing comprising an outer enclosure and an inner enclosure. A plenum separates the outer enclosure from the inner enclosure. The outer enclosure has at least one opening to allow airflow between the plenum and an exterior of the power adapter. The power adapter also includes AC/DC converter within the inner enclosure. The AC/DC converter is configured to convert an AC input signal into a DC output signal.

Some embodiments relate to a power module. The power module includes a housing comprising an outer enclosure and an inner enclosure. A plenum separates the outer enclosure from the inner enclosure. The outer enclosure has at least one opening to allow airflow between the plenum and an exterior of the power adapter. The power module also includes an AC/DC converter within the inner enclosure. The AC/DC converter is configured to convert an AC input signal into a DC output signal.

Some embodiments relate to a power adapter. The power adapter includes a housing and an AC/DC converter in the housing. The AC/DC converter is configured to convert an AC input signal into a DC output signal. The power adapter also includes at least one compartment in the housing. The at least one compartment includes a phase change material having a transition temperature between 25° C. and 85° C.

Some embodiments relate to a power adapter. The power adapter includes a housing and an AC/DC converter in the housing. The AC/DC converter is configured to convert an AC input signal into a DC output signal. The power adapter also includes a heat removal system comprising an opening in the housing and/or a heat absorbing material. The power adapter has a volume no greater than 4 cubic inches. The power adapter is configured to deliver an output power of at least 40 watts.

Some embodiments relate to power adapter. The power adapter includes a housing and an AC/DC converter within the housing. The AC/DC converter is configured to convert an AC input signal into a DC output signal. The power adapter also includes an actuated heat removal device. The actuated heat removal device is configured to remove heat produced by the AC/DC converter from the housing. The volume of the power adapter is no more than 3 cubic inches. The power adapter is configured to deliver an output power of at least 30 watts.

Some embodiments relate to power adapter. The power adapter includes a housing and an AC/DC converter within the housing. The AC/DC converter is configured to convert an AC input signal into a DC output signal. The power adapter also includes a sensor configured to detect proximity or touch of a human and an indicator device configured to produce an audible or visual output. The power adapter also includes a controller configured to control the at least one indicator device to produce the audible or visual output in response to the sensor detecting proximity or touch of a human.

Some embodiments relate to a power module. The power module includes a housing and an AC/DC converter within the housing. The AC/DC converter is configured to convert an AC input signal into a DC output signal. The volume of the power module is no more than 3 cubic inches. The power module is configured to deliver an output power of at least 30 watts.

Some embodiments relate to method. The method includes converting an AC input signal into a DC output signal using an AC/DC converter. The method also includes cooling the AC/DC converter by driving air through an enclosure for a power conversion module comprising the AC/DC converter. The volume of the power conversion module is no more than 3 cubic inches. The method also includes delivering, by the power conversion module, an output power of at least 30 watts.

The foregoing summary is provided by way of illustration, and is not intended to be limiting.

BRIEF DESCRIPTION OF DRAWINGS

In the drawings, each identical or nearly identical component that is illustrated in various figures is represented by a like reference character. For purposes of clarity, not every component may be labeled in every drawing. The drawings are not necessarily drawn to scale, with emphasis instead being placed on illustrating various aspects of the techniques described herein.

DETAILED DESCRIPTION

Figure 1:
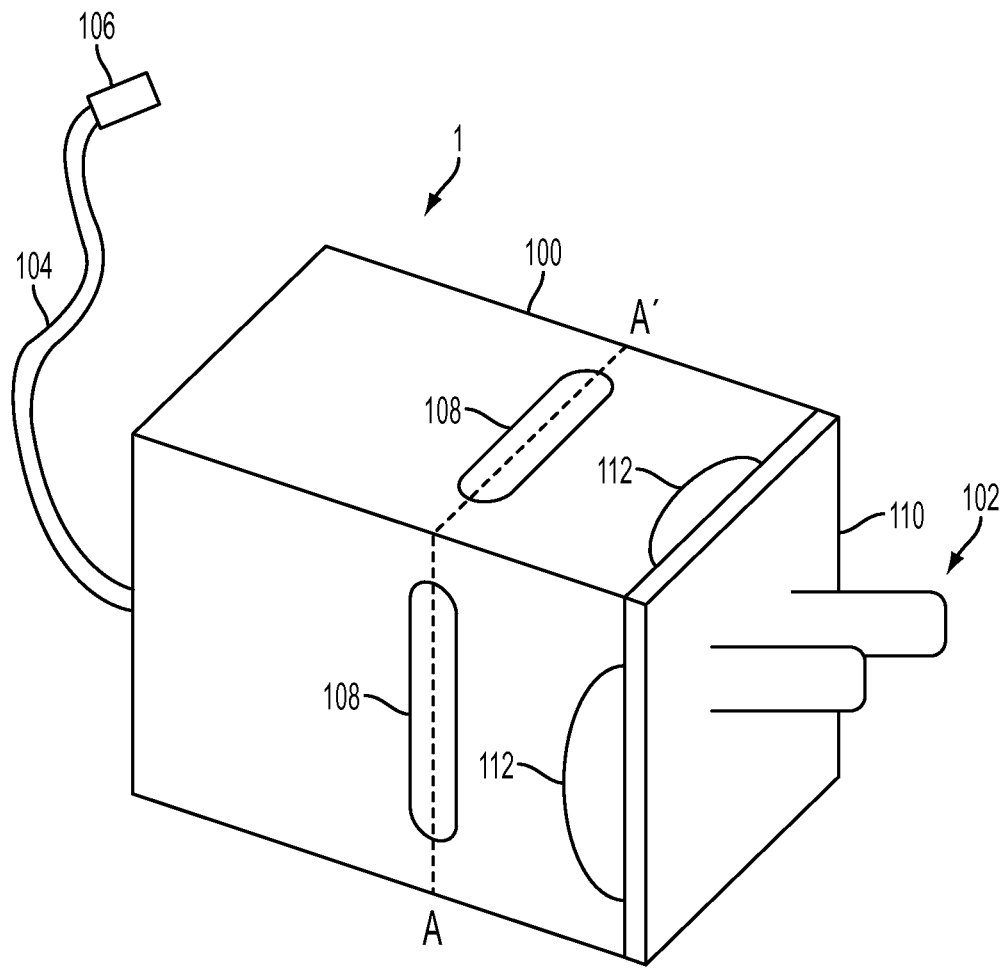
FIG. 1 shows a power adapter having an active heat removal system, according to some embodiments.

Some embodiments relate to power conversion modules, such as power adapters, having AC/DC converters that are designed to convert a standard AC mains voltage into a DC voltage to provide power to an electronic device.

As mentioned above, power adapters for portable electronic devices that consume a substantial amount of power (e.g., greater than 40 W), such as laptop computers, for example, tend to be large and bulky. The present inventors have appreciated that there are two key limitations, either of which may prevent reducing the size of such a power adapter.

One limitation is the minimum size of the passive components (e.g., inductors and capacitors) used for power conversion. If the power conversion electronics utilizes a switched mode power converter that switches at typical power converter switching frequencies, the passive components needed for such a power converter may need to be prohibitively large to provide a sufficient amount of amount of energy storage during the switching intervals. When such a limitation applies, the size of the power adapter cannot be reduced, as the ability to reduce the size of the power adapter is limited by the size of the passive components.

Using a high frequency switching power converter can allow reducing the size of the passive components, thereby allowing the size of the power adapter to be reduced. However, when a high frequency switching power converter is used, the ability to reduce the size of the power adapter is no longer limited by the size of the passive components, but by the capability of removing heat from the power adapter. Power conversion circuitry, no matter how well designed to maximize efficiency, is less than 100% efficient, and the power that is lost is converted into heat. The smaller a power adapter is made, the more challenging it becomes to remove the heat that is produced by its power conversion electronics. Failing to remove the heat adequately can cause a rise in temperature that may reduce component lifetimes and/or cause the temperature of the power adapter to exceed acceptable standards for consumer electronic devices. For example, a power adapter with a plastic housing designed for consumer electronics applications may be required to maintain an outside surface temperature of less than 85° C. to meet IEC and UL standards. Standard power adapters are not designed to remove a significant amount of heat produced in a small volume.

In accordance with some embodiments, techniques are described herein that enable forming power adapters of relatively small size that are capable of providing a significant amount of power to one or more electronic devices. The techniques described herein enable reliably removing heat from a power converter of small size. Heat removal systems are described including active heat removal systems, passive heat removal systems and hybrid heat removal systems.

In some embodiments, a power adapter includes an actuated heat removal device, such as a fan, for example, that removes heat produced by the power adapter to enable keeping the temperature of the power adapter within an acceptable operating range. In some embodiments, one or more openings are provided in the housing of the power adapter to enable the ingress of cooler air from outside the housing and the egress of heated air. Such opening(s) may be provided on more than one side of the housing to provide redundancy in case opening(s) on one or more sides of the power adapter are blocked.

FIG. 1 shows a perspective view of an example of a power adapter 1, according to some embodiments. Power adapter 1 includes a housing 100 which may be formed of plastic or any other suitable material. As shown in FIG. 1, the housing 100 may have substantially a rectangular cuboid shape with a rectangular (e.g., square) cross-section. In some embodiments, the edges of the housing may be rounded or chamfered. However, the techniques described herein are not limited a rectangular cuboid shape, as housing 100 may have any suitable shape, such as a round shape. Alternatively, in some embodiments, the housing may be substantially flat (e.g., less than a half inch or a quarter inch in height along the vertical direction of FIG. 1).

A plug 102 is provided at one end of the power adapter 1. In the embodiment of FIG. 1, plug 102 is attached to an end cap 110 which may be affixed to the housing 100. Plug 102 may be shaped to plug into a standard electrical outlet. For example, plug 102 may be shaped to plug into a standard U.S. electrical outlet that provides an AC voltage of about 120V RMS. However, the techniques described herein are not limited in this respect, as power adapter 1 may be provided with a plug shaped to plug into any suitable electrical outlet. Further, the techniques described herein are not limited as to a plug 102 being disposed on the end of the power adapter 1, as in some embodiments a cord may be provided that is attached to the end of power adapter 1, and the cord may include a suitable plug.

The power adapter 1 may be connected to a cord 104 to enable connecting the power adapter to an electronic device using connector 106. Connector 106 may have any of a variety of shapes suitable for connecting to a DC power input of a consumer electronic device.

FIG. 1 shows that the housing 100 may include one or more openings 108, 112 for allowing airflow into and/or out of the housing 100. In some embodiments, the power adapter may include an actuated heat removal device 202

Figure 3:
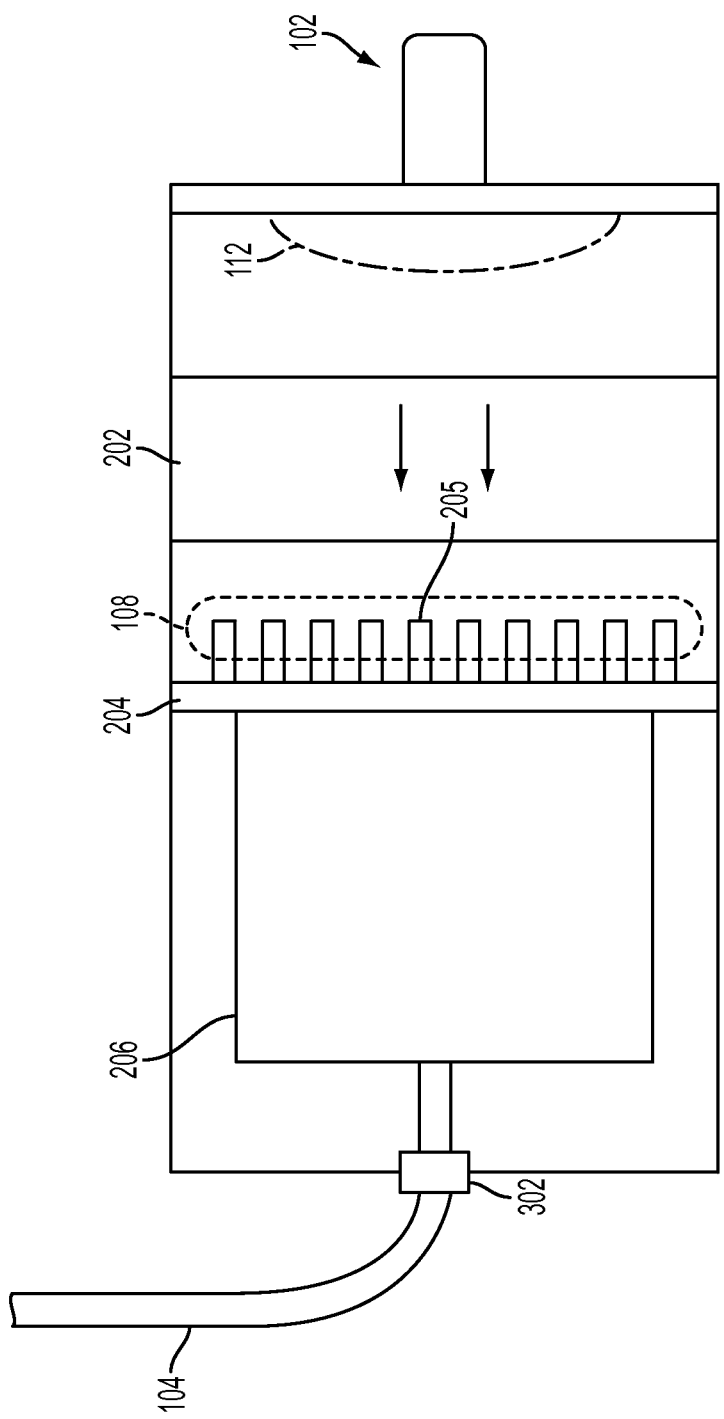
FIG. 3 shows a cutaway side view of the power adapter of FIG. 1.

(see, e.g., FIG. 3). The actuated heat removal device 202 may be a fan, for example, or another device capable of forcing airflow through the housing 100. If actuated heat removal device 202 includes a fan, any suitable type of fan may be used, such as a piezoelectric fan or an electrostatic fan, for example. In some embodiments, the fan is configured to draw cold air directly over the fan motor, thereby extending the fan's lifespan. Another suitable type of actuated heat removal device used in some embodiments is an electromechanical air pump (e.g., a bellows). An electromechanical air pump may drive puffs of air into and out of the housing. In some embodiments, if an electromechanical air pump is used, a portion of the housing may be operable as an actuatable member to drive the movement of air within the housing. The actuatable member may be a flexible membrane, in some embodiments. The actuatable member may be positioned in any location forming a contiguous space with the plenum.

Figure 2:
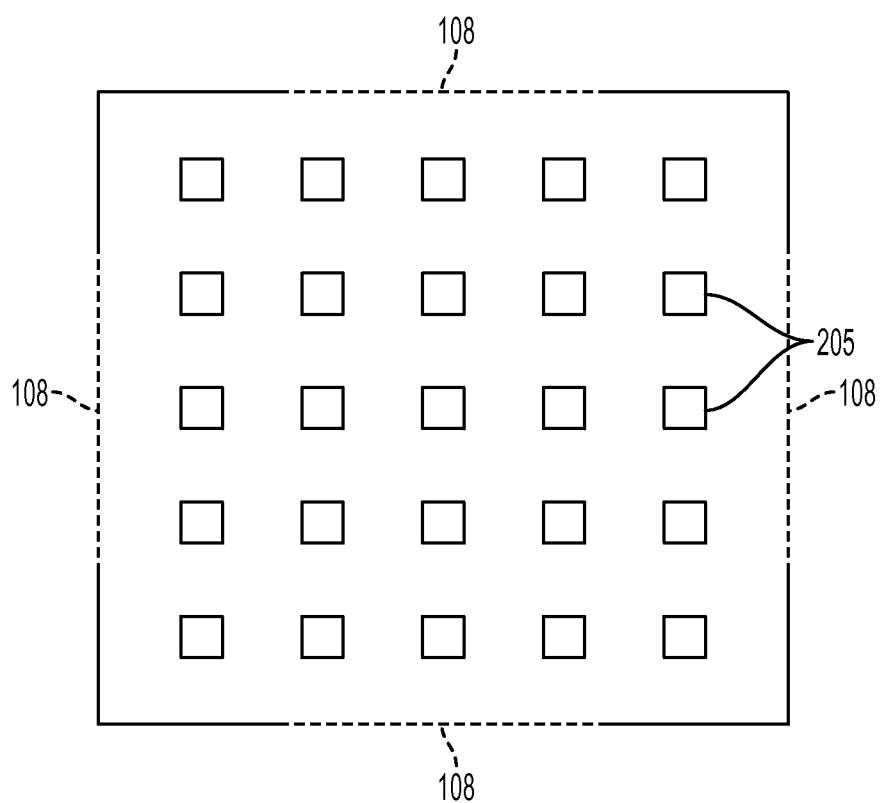
FIG. 2 shows a cross-sectional view of the power adapter of FIG. 1.

In some embodiments, an actuated heat removal device may drive the flow of air toward or away from the power conversion circuitry of the power adapter 1. As mentioned above, FIG. 1 shows that one or more openings 112 and 108 may be provided on the housing 100 for enabling the flow of air into or out of the housing. In some embodiments, openings 112 may act as inlets to enable the flow of air into the housing 100 and openings 108 may act as outlets to enable the flow of air out of the housing 100. In some embodiments, one or more openings may be provided on each side of the housing 100 disposed along the longitudinal axis of the power adapter 1. In the embodiment of FIG. 1, the housing has four sides disposed along the longitudinal axis of the power adapter, each of which includes an opening 112 (e.g., an inlet) and an opening 108 (e.g., an outlet). FIG. 2 shows a cross section of the power adapter of FIG. 1 along the dashed lines A-A'. As shown in FIG. 2, the power adapter may have four sides along the cross section defined by the dashed lines A-A'.

The inventors have appreciated that one or more sides of the power adapter may rest against one or more object(s) that may obstruct the flow of air through the openings 108 and/or 112, such as a floor, a wall, furniture, a blanket, etc. Accordingly, it may be desirable to provide openings to enable the flow of air through the housing on more than one side of the power adapter in case the flow of air through is obstructed by an object on one or more sides of the power adapter. By providing openings on more than one side of the power adapter, if a first side of the power adapter rests against an air-blocking object, airflow through the housing 100 may be provided through opening(s) on another side of the power adapter. In the embodiments of FIGS. 1-3, openings are provided on four sides of the power adapter, so that even if airflow on three sides of the power adapter is blocked, cooling may be provided by airflow through one or more openings on a fourth side of the power adapter. However the techniques described herein are not limited in this respect, as some embodiments are not limited as to the number of sides of the power adapter on which openings are disposed.

In some embodiments, if airflow through all of the openings in housing 100 is blocked, a controller of the power adapter may control the amount of power delivered by the power adapter to be reduced. The power adapter may include a temperature sensor to sense the internal temperature of the power adapter at the power conversion electronics or another location. When the temperature sensed by the temperature sensor exceeds a threshold, the controller may control the power conversion electronics such that the amount of power delivered at the output is reduced, or the delivery of power is ceased. When the power adapter cools and the temperature of the power adapter reaches a suitable operating point, the controller may control the power conversion electronics such that power delivery is be resumed and/or increased.

FIG. 3 shows a cutaway side view illustrating the interior of the power adapter 1. As shown in FIG. 3, the power adapter 1 includes power and control circuitry 206 which includes power electronics and control circuitry for converting the AC input signal (e.g., received at plug 102) into a DC output signal (e.g., provided via cord 104 to an external electronic device).

In some embodiments, power and control circuitry 206 may be disposed on a heat sink 204. The heat sink 204 may have protrusions 205 that provide a high surface area, enabling the heat produced by power and control circuitry 206 to be dissipated in a plenum within the housing. Protrusions 205 may also produce turbulent airflow within the cavity, thereby facilitating the expulsion of heat from the surface of the heat sink 204. The protrusions 205 of heat sink 204 are also illustrated in FIG. 2.

As discussed above, the actuated heat removal device 202 may be a fan that blows air toward or away from the heat sink 204. In one embodiment, illustrated in FIG. 3, the actuated heat removal device 202 is configured to force air from one or more inlet openings 112 (shown in dashed lines) toward the heat sink 204 and out through one or more outlet openings 108 (also shown in dashed lines). However, the techniques described herein are not limited in this respect, as in some embodiments the actuated heat removal device 202 may be configured to drive airflow in the opposite direction.

In some embodiments, power and control circuitry 206 may be enclosed in an airtight enclosure (and optionally potted). Sealing the power and control circuitry 206 in an airtight enclosure can isolate power and control circuitry 206 from the plenum through which air passes, which can protect the power and control circuitry 206 from foreign substances such as liquid spills, dirt, dust, etc. In the event of failure of a component within the power and control circuitry 206, the use of an airtight enclosure to seal the power and control circuitry 206 can prevent the release of odorous gasses, which can facilitate compliance with FAA regulations, for example.

The actuated heat removal device may be controlled by power and control circuitry 206 through a suitable control connection (not shown) within the housing 100. Similarly, conductors (not shown) may be provided within the housing 100 to provide a connection between the plug 102 and the power and control circuitry 206.

Described above is an embodiment in which one or more openings in the housing 100 are provided on the sides of the power adapter 1. However, the techniques described herein are not limited to providing openings in the housing 100 on the sides of the power adapter 1, as in some embodiments one or more openings may be provided at the end(s) of the adapter. For example, if a plug 102 is included, an opening may be provided between the prongs of the plug to allow air to flow into and/or out of the power adapter 1. In some embodiments, one or more spacers may be included on the end cap 110 to ensure separation between the end cap 110 and the electrical socket, thereby creating a plenum.

In some embodiments, a passive heat removal system may be provided for reliability, cost, and noise considerations. A passive heat removal system may remove heat without the use of an actuated heat removal device.

Existing power adapters have a minimum external surface area set by the power dissipated in the adapter under peak load. The power dissipated Pdiss corresponds to the difference in adapter input power and output power as determined by the adapter efficiency, η, and is equal to: Pdiss=((1−η)/η)*Pout. The magnitude of Pdiss determines the total heat flux to be carried to the adapter's surface to ensure the internal components do not overheat. In turn, the surface area over which the heat flux spreads (the surface area of the adapter system) affects the temperature of the external surface of the housing. When the surface of the housing is directly accessible (e.g., can be contacted by a person or other object), it may be maintained below a safety temperature. For plastic cases the safety temperature may be 85° C.; for metal cases it may be 75° C. In addition to surface area, other factors affect the skin temperature including its emissivity, shape factor, orientation, surrounding ambient, and in the case of an adapter which may be used in a variety of environments, whether it is in contact with another surface (such as a rug, a tabletop, or a sofa cushion). The operating temperature of external surfaces may be kept below the safety temperature, and it may be desirable to keep the temperature of the external surface of the housing even lower, such as lower than 50° C. or lower than 60° C., so that users do not find the device uncomfortable to touch or perceive a malfunction.

The result of the relationship between power dissipated, surface area, skin temperature and certain dimension limits on conventional power electronic components present in a power adapter (such as the main power converter) is to set a minimum volume (e.g., a bounding-box) of the power adapter for a given power adapter efficiency. A power adapter may not be made smaller than the bounding box volume without exceeding the desired external surface temperature. The general industry understanding is that in order for present, passively cooled adapters to be smaller, they need to be made more efficient.

Dramatically reducing the size of the power electronics with respect to power electronics of standard power adapters introduces an additional degree of freedom to the design space. In some embodiments, power electronics having a relatively high switching frequency of 1 MHz or greater may enable reducing the size of the power electronics by as much as a factor of ten, or even greater. In some embodiments, the power electronics may have a switching frequency in the VHF range (30 MHz to 300 MHz), and may utilize resonant switching techniques and/or soft switching techniques to maximize efficiency. An example of suitable power conversion circuitry is described in PCT application WO 2012/024542 (PCT/US2011/048326), which is hereby incorporated by reference in its entirety. Since the size of the power electronics may be reduced dramatically, additional options are made possible for passive heat removal, even at comparable efficiencies to present levels.

As discussed above, the heat generated by the power electronics may need to be dissipated through the bounding surface of the power adapter housing. If efficiency is not increased, the same heat flux may need to be expelled to maintain the internal adapter components at a temperature within their operating limits, and to maintain the outer surface within an acceptable temperature range. In contrast to conventional power adapters, in which nearly all of the space within the power adapter housing may be taken up by the power electronics, power electronics that switches at a high switching frequency may be made much smaller, and may consume a smaller fraction of the volume of the power adapter housing.

In some embodiments, a power adapter housing may have an inner enclosure and an outer enclosure. The inner enclosure enclosing the power electronics may have a higher temperature than that of the outer enclosure. The outer enclosure may have an outer surface that does not exceed a temperature range (e.g., below a safety temperature and/or within a range that is comfortable to the touch). The higher-temperature internal enclosure facilitates the removal of heat from the adapter electronics by convection. Convection is enabled by means of a plenum between inner enclosure and the outer enclosure. The internal enclosure of higher temperature helps to drive stronger convection currents and allow effective heat removal with a smaller total surface area. The external lower-temperature enclosure carries away some heat, but maintains a temperature that may not exceed a temperature range (e.g., below a safety temperature and/or within a range that is comfortable to the touch).

Figure 4A:
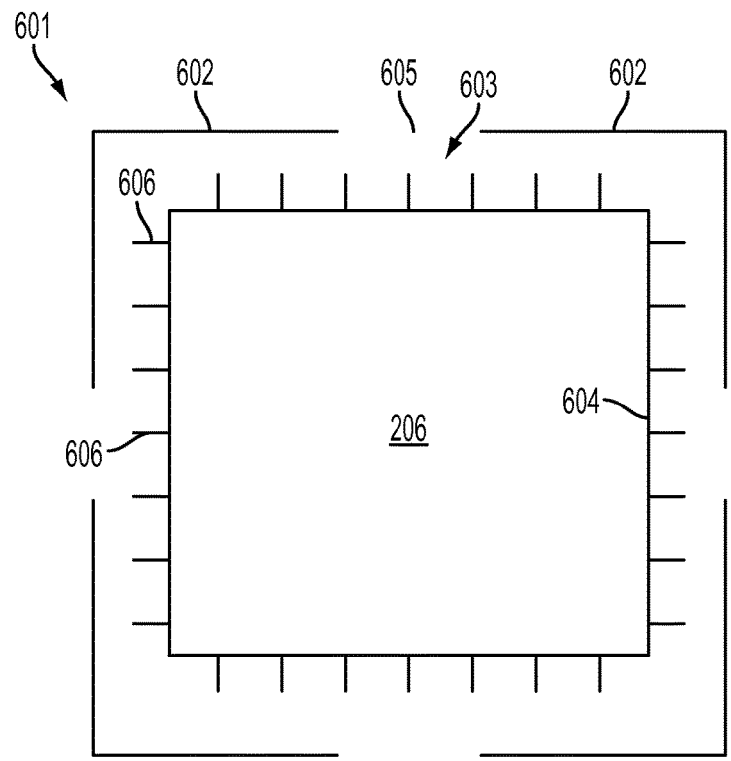
FIG. 4A shows a cross-sectional view of a power adapter of FIG. 4B having a passive heat removal system with a plurality of enclosures.
Figure 4B:
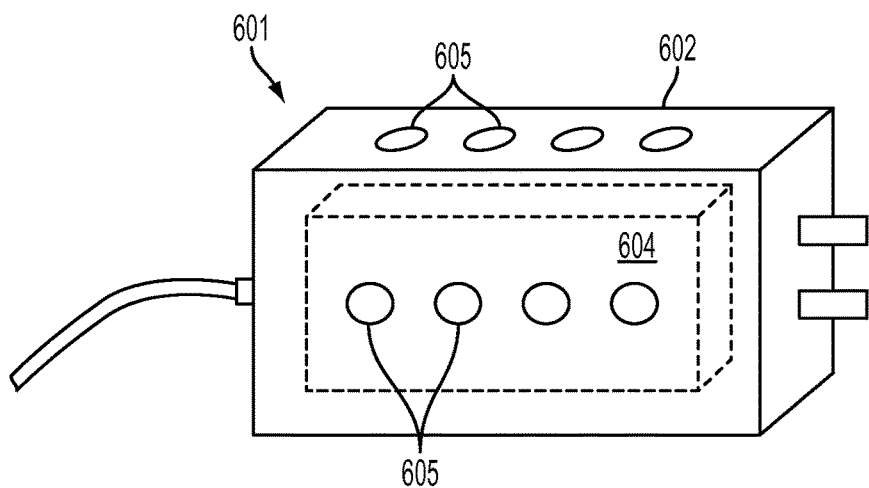
FIG. 4B shows a perspective view of a power adapter having a passive heat removal system with a plurality of enclosures.

FIG. 4A shows a cross section of a power adapter 601 having an inner enclosure 604 and an outer enclosure 602 separated by a plenum 603, according to some embodiments. FIG. 4B shows a perspective view of the power adapter 601 with inner enclosure 604 shown in dashed lines. As shown in FIG. 4A, power and control circuitry 206 may be enclosed within (e.g., sealed within) inner enclosure 604.

Inner enclosure 604 may have protrusions 606 extending therefrom to increase the surface area of inner enclosure 604 in the plenum 603 and improve convection. Protrusions 606 may include fins, heat pipes, or a combination of fins and heat pipes, or other structures. The air volume between the inner enclosure 604 and the outer enclosure 602 forms the plenum 603 where heat is transferred to convectively-driven air currents that may flow through openings 605 in the outer enclosure 602. Openings 605 may have any suitable shape. The total volume of the power adapter can be made smaller than existing adapters of the same efficiency and power level at least in part because of the increased temperature of the inner enclosure 604 and the smaller power electronics. The peak temperature of the inner enclosure 604 can be limited by the total volume allocated for the plenum 603, the shape and surface area of the protrusions 606, the emissivity of the outer surface of inner enclosure 604, and other factors.

In some embodiments, inner enclosure 604 may have a higher thermal conductivity than outer enclosure 602. The inner enclosure 604 and/or protrusions 606 may be formed of a material with a high thermal conductivity, such as a metal, for example, or any other suitable material. The outer enclosure 602 may be formed of a material with a lower thermal conductivity suitable for a user to touch, such as plastic, for example. The outer enclosure 602 may be formed of a thermally insulating material in order to keep the external touch temperature at an acceptably low level. If so, the convection currents driven through the plenum 603 by the heating of the inner enclosure 604 may carry more of the heat flux from the inner enclosure 604 to the exterior of the power adapter.

The inner enclosure 604 may be sealed, and may protect the adapter electronics from contaminants such as liquids and dirt. If inner enclosure 604 is formed of an electrically conductive material, such as metal, for example, inner enclosure 604 may form a galvanic barrier that prevents electric shock, should the user insert a conductive object into a hole in the outer skin. If inner enclosure 604 is formed of an electrically conductive material, the inner enclosure 604 may provide an effective electromagnetic interference (EMI) barrier.

The inner enclosure 604 may be designed such that convection currents can be supported regardless of the adapter orientation relative to the earth's surface. For instance, a structure having symmetry around the theta and phi axes of a spherical coordinate system can have such a behavior.

The outer enclosure 602 may have a unitary construction, as illustrated in FIGS. 4A and 4B. However, the techniques described herein are not limited in this respect, as outer enclosure 602 may have a non-unitary construction with a plurality of components forming the outer enclosure 602 in a way that can prevent the user from coming in contact with the higher temperature inner enclosure 604.

Figure 5A:
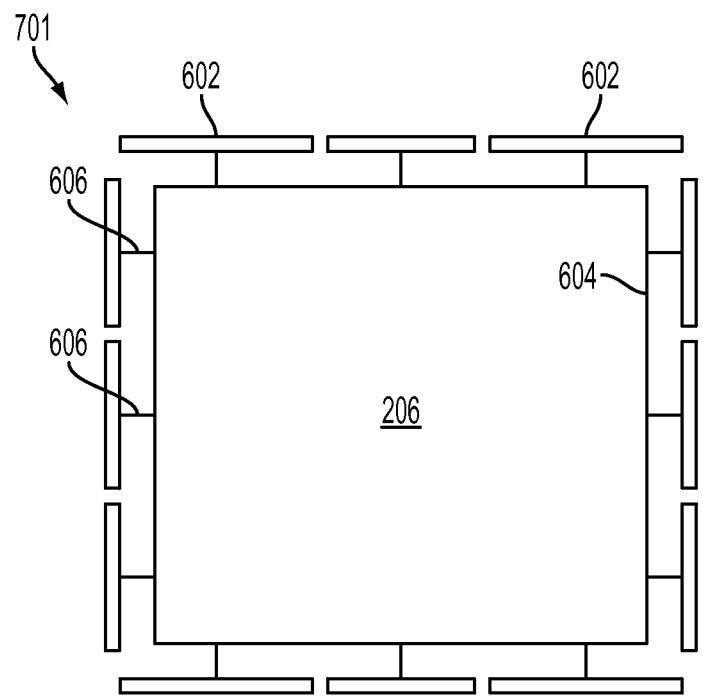
FIG. 5A shows a cross-sectional view of a power adapter of FIG. 5B having a passive heat removal system with thermally insulating caps.
Figure 5B:
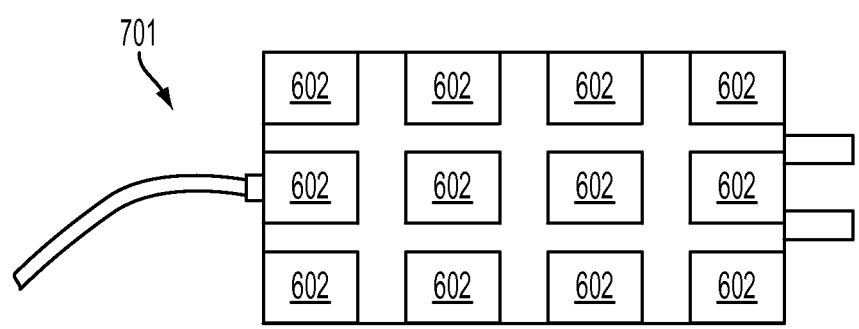
FIG. 5B shows a side view of a power adapter having a passive heat removal system with thermally insulating caps.

For example, as shown in the cross-sectional view of FIG. 5A and side view of FIG. 5B, the inner enclosure 604 of a power adapter 701 may include a number of protrusions 606 which may be heat-conducting spines. Protrusions 606 may inscribe a parallelepiped or other geometrical volume such as a rectangular cuboid. A thermally insulating cap may tip each of the protrusions 606. Collectively, the thermally insulating caps may form an outer enclosure 602 that prevents the user from direct contact with inner enclosure 604 and/or protrusions 606, and provides a lower touch temperature. The thermally insulating caps need not necessarily contact one another, although optionally may do so. The density of protrusions 606 need not be designed to prevent touch access by the user, as properly sized caps can prevent touch access by the user. The spacing of the protrusions 606 may be adjusted to maximize convective heat transfer and safety. The protrusions 606 may have any suitable shapes such as a cylindrical shape, a fin shape, or may have arbitrarily curved or straight surfaces.

In some embodiments, a power adapter may have a hybrid heat removal system that utilizes passive cooling a portion of the time and used active cooling at other times. For example, a hybrid heat removal system may have an actuated heat removal device that is turned off when it is not needed but is turned on to actively remove heat as needed. For example, the temperature of the power adapter may be sensed and a controller of the power adapter may turn on actuated heat removal device when the temperature exceeds a threshold. In some embodiments, a hybrid heat removal system may avoid a need to increase adapter size to handle worst-case heat loads in a passive heat removal system. In some embodiments, a hybrid heat removal system may be more reliable than an active heat removal system where the cooling actuator runs a larger portion of the time (e.g., continuously). A hybrid heat removal system may enable using a smaller actuated heat removal device than in a purely active heat removal system. A hybrid heat removal system that intermittently operates in an active mode can reduce wear on the moving components, reduce noise, and/or reduce problems such as the collection of dirt or dust. In some embodiments, a hybrid heat removal system may have a housing with a plurality of enclosures, as shown in FIG. 4 or 5, for example, as well as an actuated heat removal device 202 (e.g., as illustrated in FIG. 3). In some embodiments, a hybrid heat removal system may have an actuated heat removal device 202 and a material with a high thermal mass. A passive heat removal system using a material with a high thermal mass will be discussed in connection with FIGS. 6 and 7.

The techniques described herein for controlling heat in a power adapter may be particularly useful in a power adapter having a relatively small volume. As discussed above, such techniques may include actively removing heat from the power adapter using an actuated heat removal device, such as a fan or bellows, to expel heated air from the power adapter housing. Such techniques may include passively removing heat from the power adapter using a housing having an inner enclosure and an outer enclosure having one or more openings. However, has been appreciated that it may be desirable to control heat in a power adapter without the use of openings in the power adapter housing, as such openings may have disadvantages. For example, openings in the power adapter housing may enable the ingress of dirt, dust, or moisture, which may reduce the lifespan of the power adapter. Openings in the power adapter housing may become blocked, thereby reducing heat removal efficiency. Some manufacturers and consumers may prefer a fully enclosed power adapter for reasons of product appearance and/or compliance with safety regulations.

In some embodiments, consideration of the manner in which a power adapter is to be used can allow designing a power adapter that operates with a suitable operating temperature yet which does not require openings in the housing to remove heat. An exemplary use for a power adapter is powering an electronic device, such as a laptop computer. The largest amount of power may be drawn by a laptop when the battery of the laptop is being charged. A typical laptop battery may take about 1.5-2.5 hours to fully charge from an uncharged state. During this time, a significant amount of power (greater than 40 W or 60 W) may be continually provided to the laptop battery via the power adapter. Once the battery reaches approximately 80% charge, the amount of power that is drawn may be reduced. Charging the battery consumes much more power than simply powering the laptop itself. Even if the processor of a laptop computer is running at full utilization, the maximum power draw from the processor may be no more than thermal design power which may be as low as 13 W for ultrabooks, which is far less than the amount of power needed to charge the battery. Thus, in a typical use case where a laptop with a drained battery is plugged into a power adapter, the power adapter will supply a significant amount of power for about 1.5-2.5 hours, then, once the battery is charged, the power demand drops to a lower level.

The present inventors have recognized and appreciated that the heat in a power adapter can be managed by increasing the thermal mass of the power adapter so that the temperature on the exterior surface of the power adapter does not rise above maximum (e.g. 30-40° C.) for the time period of about 1.5-2.5 hours while the power adapter provides power to charge a laptop battery. In the lifecycle of the typical laptop power adapter, the power delivery requirements typically drop at that point, allowing the power adapter time to dissipate the accumulated heat.

In some circumstances, a user may decide to use the power adapter in a way that does not follow the typical usage pattern for power adapter. For example, a user may decide to charge a battery, then remove the battery and charge a second battery immediately thereafter. However such a use case is relatively rare, and can be handled by reducing the amount of power provided by the power adapter in such a circumstance, or designing the power adapter to have an increased thermal mass to account for this scenario.

As discussed above, it is desirable to produce a power adapter having a relatively small volume. However, decreasing the mass of the power adapter conflicts with increasing the thermal mass of the power adapter, as there is less space to accommodate material that can absorb heat.

In some embodiments, a power adapter may include a material with a relatively high thermal mass, or capability of absorbing heat. By including a material with a high thermal mass, the power adapter may have a high ratio of thermal mass to volume. The thermal mass of the power adapter may be increased to a point where the power adapter is capable of charging a laptop battery for 1.5-2.5 hours (e.g., at a power of greater than 40 W or 60 W) without increasing the surface temperature of the power adapter housing above a desired level. In some embodiments, the material with a relatively high thermal mass may be a phase change material that absorbs heat by producing a phase change in the material. For example, a phase change material may change from a solid material to a liquid material at a transition temperature. Phase change materials can be designed that have different transition temperatures. In some embodiments, a phase change material may be selected that has a transition temperature suitable for absorbing heat in a power adapter and limiting the surface temperature of the power adapter to a desired operating range (e.g., below about 30-40° C.). A phase change material may be selected with a transition temperature close to the desired operating range. For example, in some embodiments a phase change material may be selected that has a transition temperature of approximately 30-40° C. However, this is merely by example, and other transition temperatures may be used. A suitable amount of phase change material may be included to prevent the surface of the power adapter from rising above a selected temperature during a time interval, such as the time needed for charging a laptop battery, as discussed above.

In some embodiments, the power adapter may include one or more compartments to contain phase change material. Such compartments may be sealed, to prevent the phase change material from leaking therefrom in a liquid state. In some embodiments, the phase change material may be provided in compartments around the exterior of the power adapter. Since in the solid state phase change material may have a relatively low thermal conductivity, the compartments of phase change material may be arranged in such a way that they can absorb heat generated in the power adapter without unduly blocking the conduction of heat to the surface of the power adapter. In other words, the power adapter may be designed such that the phase change material does not overly block flux of heat from the interior to the exterior of the power adapter. In some embodiments, the power adapter may include a material with a high thermal conductivity to provide a path of high thermal conductivity for heat to flow from the interior of the power adapter to the exterior. Any suitable material with a high thermal conductivity may be used, such as a metal (e.g., aluminum). By providing high-thermal-conductivity paths from the interior to the exterior of the power adapter, heat can be more readily removed from the phase change material. This can reduce the amount of time needed to remove heat from the power adapter. so that the reset time is not overly high.

The phase change material may only absorb a fraction of the heat generated by the adapter. The rest of the heat may leave through the outer surface of the adapter housing. The ratio of absorption to convective removal depends upon the temperature the outer skin is allowed to reach (which is in turn a function of the transition temperature of the phase change material and the ratio of high-thermal-conductivity paths from the power converter to the external surface vs. the paths through the phase change material).

Figure 6A:
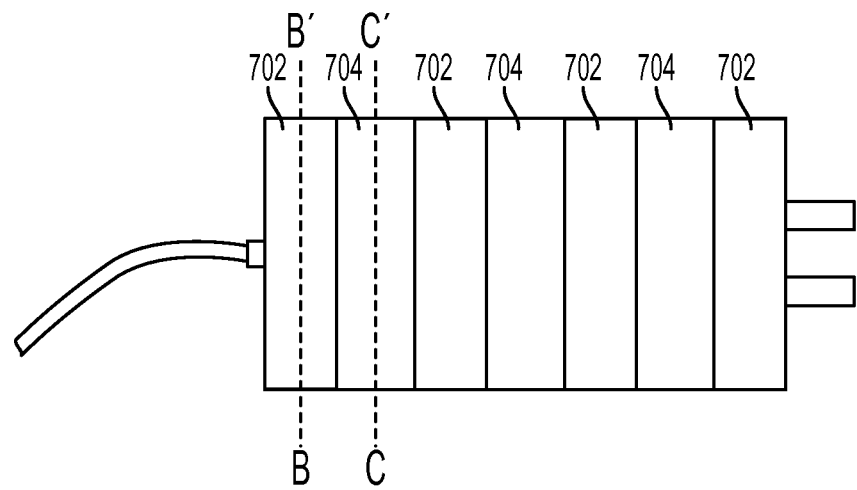
FIG. 6A shows a cutaway side view of a power adapter having a passive heat removal system with regions of high thermal mass.
Figure 6B:
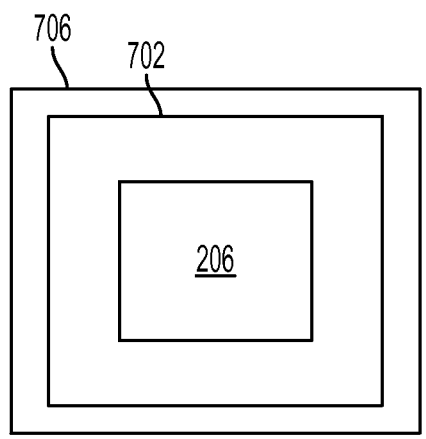
FIG. 6B shows a cross-sectional view of the power adapter of FIG. 6A along the line B-B'.
Figure 6C:
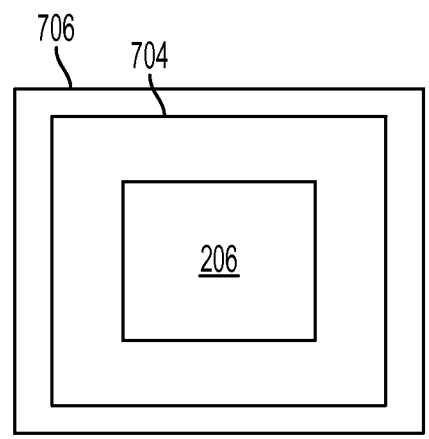
FIG. 6C shows a cross-sectional view of the power adapter of FIG. 6A along the line C-C'.

FIG. 6A illustrates a cutaway side view of a power adapter having a relatively high thermal mass, according to some embodiments. FIG. 6B shows a cross section of the power adapter of FIG. 6A along the line B-B'. FIG. 6B shows a cross section of the power adapter of FIG. 6A along the line C-C'. The power adapter of FIGS. 6A-6C includes compartments of phase change material 704 that alternate with regions of high thermal conductivity 702 e.g., metal. The material high thermal conductivity 702 may allow the conduction of heat from the interior to the exterior the power adapter, while the phase change material 704 may provide a high thermal mass and enable absorbing a significant amount of heat. An outer enclosure 706 may be formed around the periphery of the power adapter and may be formed of a material of low thermal conductivity (e.g., plastic) suitable to be touched by a user.

Figure 7A:
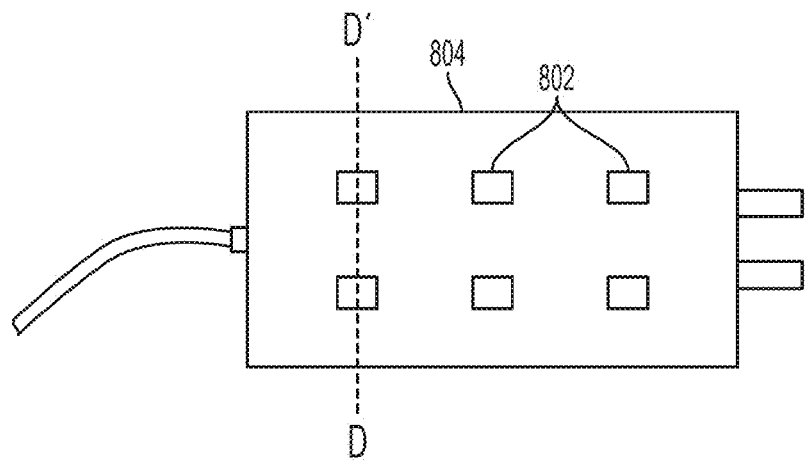
FIG. 7A shows a cutaway side view of a power adapter having a passive heat removal system with regions of high thermal conductivity and regions of high thermal mass.
Figure 7B:
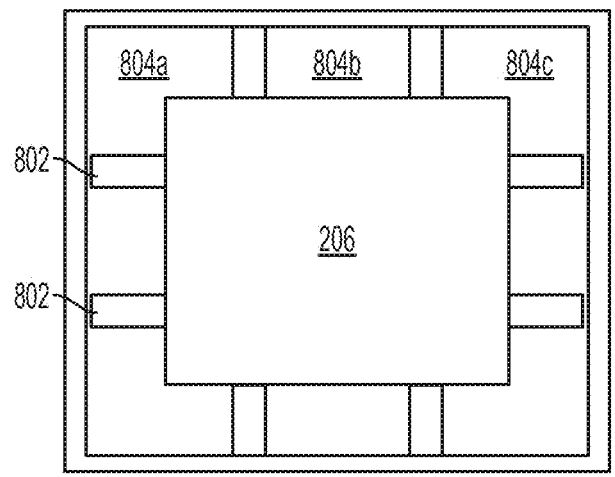
FIG. 7B shows a cross-sectional view of the power adapter of FIG. 7A.

FIG. 7A shows a side view and FIG. 7B shows a cross-sectional view along the line D-D' of a power adapter according to another embodiment in which compartment(s) of phase change material are distributed around the housing of the power adapter. Regions of high thermal conductivity 802 (e.g., metal) may be formed between the regions of high thermal mass 804 (e.g., which may include phase change material). FIG. 7A illustrates that the regions of high thermal conductivity 802 may be posts extending from the interior to the exterior of the power adapter.

Increasing the thermal mass of the power adapter may enable controlling heat without requiring forming openings in the power adapter housing to allow heated air to be expelled. However, in some embodiments, openings may be included in the housing to facilitate convective heat transfer. In this respect, the technique of increasing the thermal mass of the power adapter may be combined with another passive heat removal concept, such as a housing having inner and outer enclosures. Alternatively or additionally, the technique of increasing the thermal mass of the power adapter may be combined with an active heat removal concept, such as the use of an actuated heat removal device.

In some embodiments, a power adapter may be configured to "quick charge" an electronic device. Using conventional power adapters, it may take 1-3 hours or longer to charge the battery of a consumer electronic device such as a mobile phone, tablet computer, or laptop computer. For example, a conventional power adapter that delivers 15 W may take about an hour to charge the battery of a tablet computer from a fully drained state. It can be desirable to charge mobile devices more quickly, particularly where limited time is available for battery charging. As an example, a traveler may wish to charge the battery of a mobile phone or tablet computer prior to boarding a flight. In some embodiments, a power adapter may provide a higher amount of power to enable charging the battery more quickly. For example, a power adapter may deliver 60 W, which may allow charging a mobile device or tablet computer in a fraction of an hour (e.g., less than fifteen minutes), as compared to taking 1 hour with a power adapter that delivers 15 W.

The present inventors have appreciated that a power adapter designed for "quick charging" may require less capability of absorbing heat than a power adapter designed to charge a laptop battery for a period of hours, as a "quick charging" power adapter may only deliver power for a relatively short time interval (e.g., less than an hour, such as 15-30 minutes or less). A "quick charging" power adapter that includes material with a high thermal mass (e.g., phase change material) may include less such material than a power adapter designed to deliver power for a larger time period. Alternatively or additionally, the heat removal device may operate intermittently (e.g., with a lower duty ratio). In some embodiments, a "quick charging" power adapter may be designed to be smaller than a power adapter designed to deliver power for a longer time period.

Figure 8:
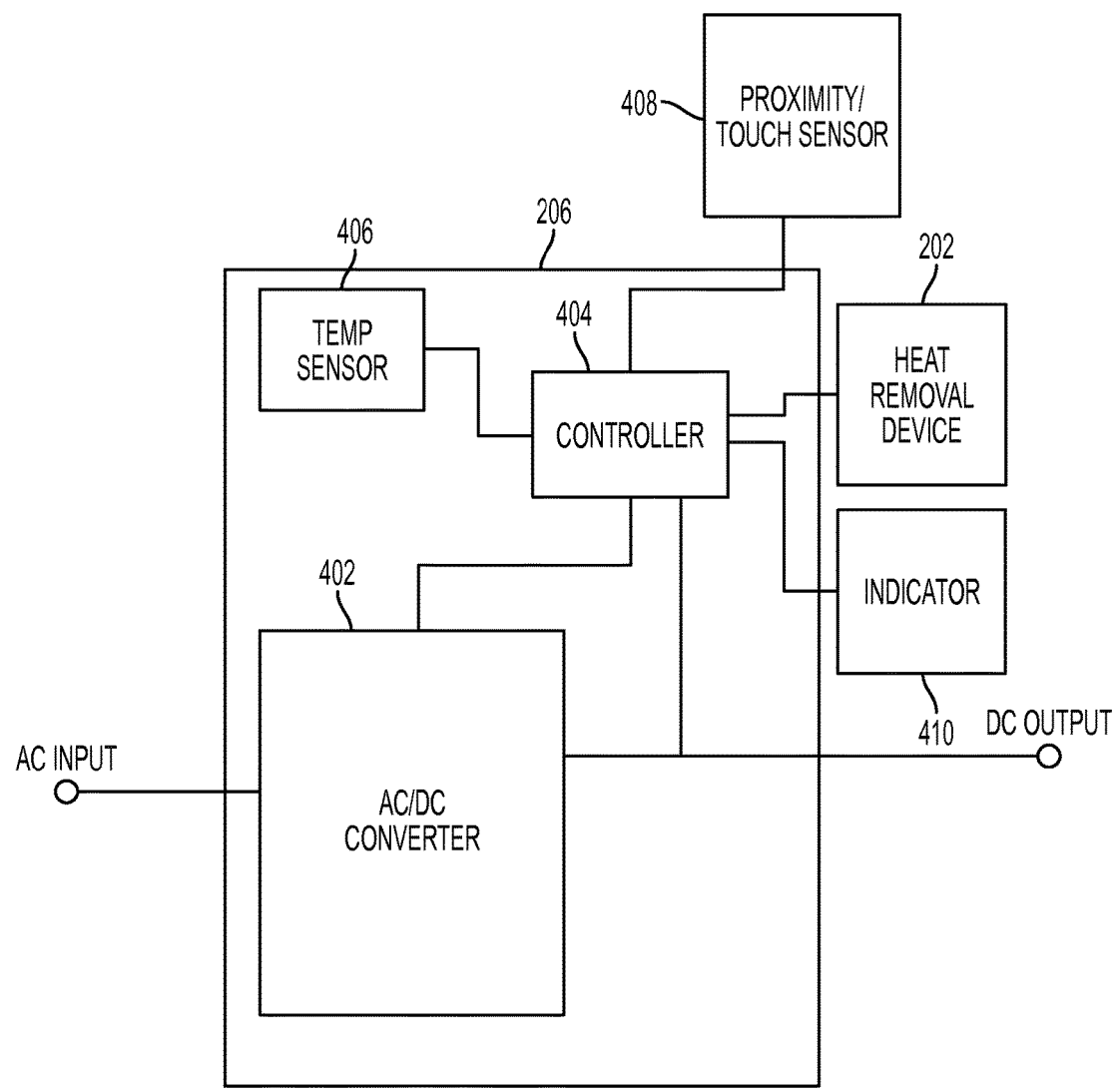
FIG. 8 shows a block diagram illustrating power and control circuitry 206, as well as optional sensors and an indicator device.

FIG. 8 shows a block diagram illustrating power and control circuitry 206, as well as optional sensors and an indicator device, according to some embodiments. As shown in FIG. 8, power and control circuitry 206 is connected to receive an AC input voltage, such as an AC line voltage. An AC to DC converter 402 is configured to convert the AC input voltage into a DC output voltage. In some embodiments, AC to DC converter 402 may include a rectifier followed by a DC/DC converter. The DC/DC converter may operate at a relatively high switching frequency, such as in the VHF range (30 MHz to 300 MHz), and may utilize resonant switching techniques and/or soft switching techniques to maximize efficiency. Suitable power conversion circuitry is described in PCT application WO 2012/024542 (PCT/US2011/048326), filed Aug. 18, 2011, which is hereby incorporated by reference in its entirety. However, the techniques described herein are not limited in this respect, as other suitable types of AC/DC converters may be used.

Controller 404 may control the operation of AC/DC converter 402 and actuated heat removal device 202 using suitable control signals provided thereto. In some embodiments, as discussed above, controller 404 may receive a signal from temperature sensor 406, and may control the AC/DC converter 402 to reduce the amount of power that is delivered when the temperature exceeds a threshold. In some embodiments, controller 404 may increase or decrease the actuation of actuated heat removal device 202 (e.g., if a fan is used, the speed of the fan may be changed) in response to the temperature signal from temperature sensor 406.

In some embodiments, a power adapter may include a touch or proximity sensor 408 to detect when a person (e.g., a hand, for example) comes close to or touches the power adapter. In response to a signal detected by the touch or proximity sensor 408, a human-perceptible effect may be produced. For example, the power adapter may include an indicator device 410, such as a lighting device (e.g., an LED) to produce light, and/or a device that can produce an audible sound. In response to a signal detected by the touch or proximity sensor 408, the indicator device 410 may be turned on. For example, a lighting device may illuminate, which may assist a user in finding the power adapter in the dark. As another example, an audible sound may be played, which may assist a user in finding an adapter that is in a difficult to reach location (e.g., under or behind furniture, for example). In some embodiments, if an indicator device 410 is included, the power adapter may include an energy storage device such as a battery or ultracapacitor to provide power to the indicator device.

In some embodiments, the controller 404 may be configured to change the actuation of the actuated heat removal device 202 in response to detecting touch or proximity of a person. For example, in some embodiments the actuation of the actuated heat removal device 202 may be reduced or stopped in response to detecting touch or proximity of a human hand.

In some embodiments, controller 404 may measure an amount of power provided to input of the power adapter and/or at the output of the power adapter. The power adapter may have an interface, such as a wired or wireless interface (e.g., a WiFi or Bluetooth interface device) to enable communication with an external device. The power adapter may send information regarding the measured power and/or total energy to the external device (e.g., a laptop computer, tablet computer, smartphone or server) so that a person (e.g., a user) can view the information to find out how much power is consumed by a device connected to the output of the power adapter.

In some embodiments, a power adapter may include one or more DC output connection ports that enable one or more cords to be removably connected thereto. In some embodiments, one or more cords may be provided having electrical connector(s) designed to connect to the DC output connection port(s) of the power adapter. The cord's connector may be held in place at the DC output connection port using any suitable technique, such as a mechanical connection and/or through magnetic attraction.

Figure 9:
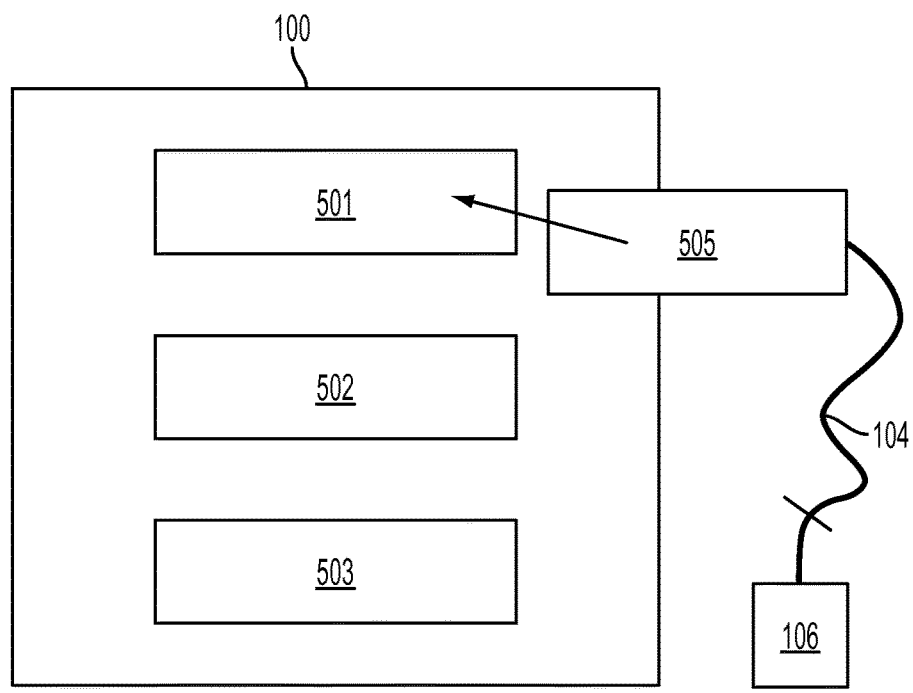
FIG. 9 shows a power adapter having a plurality of DC output connection ports.

FIG. 9 shows that a power adapter may have a plurality of DC output connection ports 501, 502 and 503. The side of the power adapter shown in FIG. 9 may correspond to the end of the power adapter to which cord 104 is connected (e.g., the left side of FIG. 1, for example). As shown in FIG. 9, cord 104 may have a connector 505 configured to removably connect to DC output connection port 501. Cord 104 may have a connector 106 for connecting to a first type of electronic device (e.g., a laptop). Other cords may be provided having the same type of connector 505 but different connectors 106 for connecting to other types of electronic devices (e.g., smart phones, tablet computers, etc.). Such cords may be provided in a kit along with the power adapter, in some embodiments. Accordingly, a user may select a suitable cord having the appropriate connector 106 to connect to a device that the user wishes to power and/or charge. Advantageously, power adapter may be a universal power adapter that is capable of charging a plurality of different devices (e.g., laptops, cellular telephones, tablet computers, etc.). Accordingly, a user may travel with one small universal power adapter that is capable of charging multiple different devices, rather than carrying multiple power adapters dedicated to each of the user's devices.

In some embodiments, each cord that may be connected to DC output connection port 501 may be individually identifiable by the power adapter when it is plugged in. For example, when a user plugs in a particular type of cord to a DC output connection port, the power adapter may determine the type of cord that is plugged in. Such a determination may be made in any of a variety of ways. For example, the cord may be designed to have a certain impedance when measured, and the power adapter may perform an impedance measurement on a cord when it is connected to identify it. As another example, the cord may be provided with an integrated circuit that identifies the cord. Such an integrated circuit may be provided in connector 505 and/or connector 106, by way of example. As another example, a cord may be identified based on time domain reflectometry. Any suitable technique for identifying a cord may be used.

The power adapter (e.g., controller 404) may determine a suitable DC output voltage to be provided based on identification of the cord. For example, when a first cord is plugged in, the power adapter may identify the cord as being designed to provide a 5V DC output voltage. Accordingly, the controller 404 may control the AC/DC converter 402 to provide a 5V DC output voltage to the corresponding DC output port to which the cord is connected. If another cord is plugged into the same DC output port, the power adapter may identify the cord as being designed to provide a 9V DC output voltage. Accordingly, the controller 404 may control the AC/DC converter 402 to provide a 9V DC output voltage to the DC output port.

In some embodiments, a power adapter is capable of powering and/or charging a plurality of devices at the same time. For example, a first connector of a first cord may plug into DC output connection port 501 for powering a laptop, a second connector of a second cord may plug into a DC output connection port 502 for powering a cellular telephone, and/or a third cord may plug into DC output connection port 503 for powering another device. In a power adapter configured to power and/or charge a plurality of devices at a time, the AC/DC converter may be configured to provide a plurality of DC outputs of suitable output voltages to the respective DC output connection ports. The output voltages of the DC outputs may be different, to enable charging different types of devices, or may be the same.

DC output connection ports 501, 502 and 503 may be the ports of the same shape and type or ports of different shapes and/or types to accept different types of connectors. In some non-limiting embodiments, one or more of the DC output connection ports may be USB ports (e.g., USB 3.0 ports). However, the techniques described herein are not limited as to the particular types of connection port(s) employed.

As discussed above, the power adapters described herein are capable of providing significant output power in a small sized housing. In some embodiments, the volume of the power adapter (excluding cords) may be relatively small, such as 5 cubic inches or less, 4 cubic inches or less, 3 cubic inches or less, or 2 cubic inches or less. For example, in some embodiments the power adapter may be about 2 inches in length or less, about 1 inch in width, or less and about 1 inch in height or less. In some embodiments, the output power provided by the power adapter is at least 30 W, such as at least 40 W, at least 45 W at least 60 W, at least 80 W, or at least 100 W or higher. In some embodiments, the power converter may provide a power conversion density of 15 W/in$^3$ or higher, 20 W/in$^3$ or higher, 30 W/in$^3$ or higher, 40 W/in$^3$ or higher, or 50 W/in$^3$ or higher. The term "power conversion density" refers to the maximum amount of power a power conversion module (e.g., a power adapter) can deliver divided by the volume of the power conversion module (i.e., as bounded by the housing of the power adapter, and excluding cords).

Described above is a power adapter which may be used for powering and/or charging consumer electronic devices. However, the techniques described herein are not limited to power adapters for consumer electronic devices. Some embodiments relate to a power conversion module for other electronic devices, such as servers or other devices in a data center, which may benefit from a reduction in size of the power electronics. Other non-limiting examples of applications include power electronics for industrial equipment and electronics for automobiles, aircraft and ships.

Various aspects of the apparatus and techniques described herein may be used alone, in combination, or in a variety of arrangements not specifically discussed in the embodiments described in the foregoing description and is therefore not limited in its application to the details and arrangement of components set forth in the foregoing description or illustrated in the drawings. For example, aspects described in one embodiment may be combined in any manner with aspects described in other embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A power adapter, comprising:
   a housing;
   power and control circuitry in the housing, the power and control circuitry including an AC/DC converter configured to convert an AC input signal into a DC output signal;
   at least one compartment in the housing, the at least one compartment comprising a phase change material, the at least one compartment including a first compartment positioned around the power and control circuitry on at least four sides of the power and control circuitry or a plurality of compartments either individually or collectively positioned around the power and control circuitry on at least four sides of the power and control circuitry, the phase change material having a transition temperature between 25° C. and 85° C.; and
   a second material having a thermal conductivity higher than that of the phase change material, the second material extending from the power and control circuitry toward the housing, the second material separating first and second regions of the phase change material on at least a first side of the at least four sides of the power adapter.

2. The power adapter of claim 1, wherein the transition temperature of the phase change material is between 30° C. and 50° C.

3. The power adapter of claim 1, wherein the second material comprises a metal.

4. The power adapter of claim 1, wherein the power adapter has a volume no greater than 3 cubic inches.

5. The power adapter of claim 4, wherein the phase change material is of a volume and configuration such that a temperature of an exterior surface of the housing remains below a temperature of 40° C. when the power adapter delivers an average power of at least 45 W for a period of at least 30 minutes.

6. The power adapter of claim 5, wherein the period of the at least 30 minutes is 2 hours.

7. The power adapter of claim 1, wherein the power and control circuitry further includes a controller configured to control the AC/DC converter, wherein the controller is configured to change an amount of output power produced by the AC/DC converter based on a temperature of the power adapter.

8. The power adapter of claim 7, wherein the power adapter has a volume no greater than 4 cubic inches.

9. The power adapter of claim 1, further comprising:
   a plurality of posts comprising the second material, the plurality of posts extending from an interior of the power adapter toward a periphery of the power adapter.

10. The power adapter of claim 9, wherein the plurality of posts are on the first side and a second side of the at least four sides of the power adapter.

11. The power adapter of claim 10, wherein the plurality of posts are further on third and fourth sides of the at least four sides of the power adapter.

12. The power adapter of claim 9, wherein at least one post of the plurality of posts contacts the housing.

13. The power adapter of claim 1, wherein the at least one compartment comprises a plurality of compartments, each of the compartments comprising the phase change material, wherein the first compartment of the plurality of compartments is separated from a second compartment of the plurality of compartments by a region of the second material.

14. The power adapter of claim 13, wherein each of the first compartment, the second compartment and the region of the second material surrounds the power and control circuitry.

15. The power adapter of claim 1, comprising alternating regions of the second material and the phase change material.

16. A power adapter, comprising:
a housing;
power and control circuitry in the housing, the power and control circuitry including an AC/DC converter configured to convert an AC input signal into a DC output signal;
a first end including a plug comprising a plurality of prongs to receive the AC input signal;
a second end having a DC output connection port configured to connect to a connector of a cord to provide the DC output signal to the cord;
at least one compartment in the housing, the at least one compartment comprising a phase change material, the at least one compartment including a first compartment positioned around the power and control circuitry on at least four sides of the power and control circuitry or a plurality of compartments either individually or collectively positioned around the power and control circuitry on at least four sides of the power and control circuitry; and
a second material having a thermal conductivity higher than that of the phase change material, the second material separating first and second regions of the phase change material on at least a first side of the power adapter,
wherein the power adapter has a volume no greater than 4 cubic inches, and
wherein the power adapter is configured to deliver an output power of at least 40 watts.

17. The power adapter of claim 16, wherein the phase change material has a transition temperature such that the phase change material changes phase during operation of the power adapter.

18. The power adapter of claim 17, wherein the transition temperature of the phase change material is between 25° C. and 85° C.

19. The power adapter of claim 16, further comprising: a plurality of posts comprising the second material, the plurality of posts extending from an interior of the power adapter toward a periphery of the power adapter.

20. The power adapter of claim 19, wherein the plurality of posts are on the first side and a second side of the power adapter.

21. The power adapter of claim 20, wherein the plurality of posts are further on third and fourth sides of the at least four sides of the power adapter.

22. The power adapter of claim 19, wherein at least one post of the plurality of posts contacts the housing.

23. The power adapter of claim 16, wherein the at least one compartment comprises a plurality of compartments comprising the phase change material, wherein the first compartment of the plurality of compartments is separated from a second compartment of the plurality of compartments by a region of the second material.

24. The power adapter of claim 23, wherein each of the first compartment, the second compartment and the region of the second material surrounds the power and control circuitry.

25. The power adapter of claim 16, comprising alternating regions of the second material and the phase change material.

26. A power adapter, comprising:
a housing;
power and control circuitry in the housing, the power and control circuitry including an AC/DC converter configured to convert an AC input signal into a DC output signal;
at least one compartment in the housing, the at least one compartment comprising a phase change material, the at least one compartment including a first compartment surrounding the power and control circuitry or a plurality of compartments either individually or collectively surrounding the power and control circuitry, the phase change material having a transition temperature between 25° C. and 85° C.; and
a second material having a thermal conductivity higher than that of the phase change material, the second material extending from an interior of the power adapter toward a periphery of the power adapter, the second material separating first and second regions of the phase change material.

27. The power adapter of claim 26, wherein the transition temperature of the phase change material is between 30° C. and 50° C.

28. The power adapter of claim 26, wherein the second material comprises a metal.

29. The power adapter of claim 26, further comprising:
a plurality of posts comprising the second material, the plurality of posts extending from an interior of the power adapter toward the periphery of the power adapter.

30. The power adapter of claim 29, wherein at least one post of the plurality of posts contacts the housing.

31. The power adapter of claim 26, wherein the at least one compartment comprises a plurality of compartments comprising the phase change material, wherein the first compartment of the plurality of compartments is separated from a second compartment of the plurality of compartments by a region of the second material.

32. The power adapter of claim 26, wherein the power adapter has a volume no greater than 4 cubic inches.

* * * * *